United States Patent [19]

Chan et al.

[11] Patent Number: 4,930,107

[45] Date of Patent: May 29, 1990

[54] METHOD AND APPARATUS FOR PROGRAMMING AND VERIFYING PROGRAMMABLE ELEMENTS IN PROGRAMMABLE DEVICES

[75] Inventors: Yiu-Fai Chan, Saratoga; Chuan-Yung Hung, Cupertino, both of Calif.

[73] Assignee: Altera Corporation, San Jose, Calif.

[21] Appl. No.: 229,852

[22] Filed: Aug. 8, 1988

[51] Int. Cl.$^5$ ............................................. G11C 7/00
[52] U.S. Cl. ........................ 365/189.08; 365/230.09; 365/240
[58] Field of Search .................. 365/189.08, 185, 104, 365/201, 230.09; 307/465; 364/716; 340/825.83

[56] References Cited

U.S. PATENT DOCUMENTS

| | | | |
|---|---|---|---|
| 3,566,153 | 2/1971 | Spencer, Jr. ............................ | 307/205 |
| 4,124,899 | 11/1978 | Birkner et al. ....................... | 364/716 |
| 4,347,587 | 8/1982 | Rao .................................. | 365/230.09 |
| 4,524,430 | 6/1985 | Page ................................. | 365/189 |
| 4,609,986 | 9/1986 | Hartmann et al. .................... | 364/200 |
| 4,617,479 | 10/1986 | Hartmann et al. .................... | 307/465 |
| 4,713,792 | 12/1987 | Hartmann et al. .................... | 364/900 |
| 4,761,768 | 8/1988 | Turner et al. ....................... | 365/201 |

Primary Examiner—Joseph A. Popek
Attorney, Agent, or Firm—Jeffrey H. Ingerman

[57] ABSTRACT

A method and apparatus for programming programmable logic arrays using fewer chip resources is provided. The programmable elements in the programmable logic arrays are serially addressed using shift registers. The method and apparatus are particularly useful in conserving resources on a chip containing several programmable arrays.

24 Claims, 12 Drawing Sheets

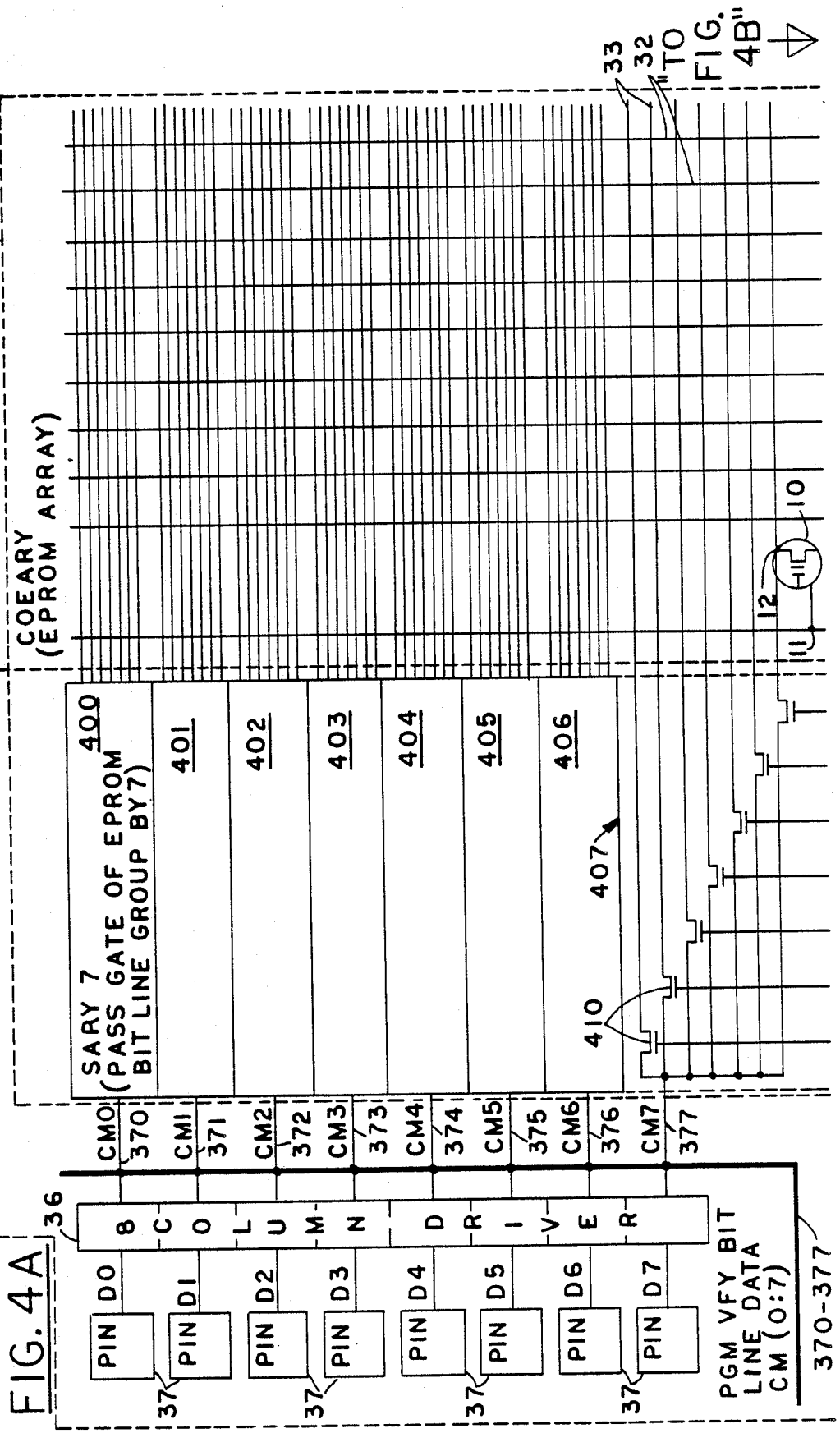

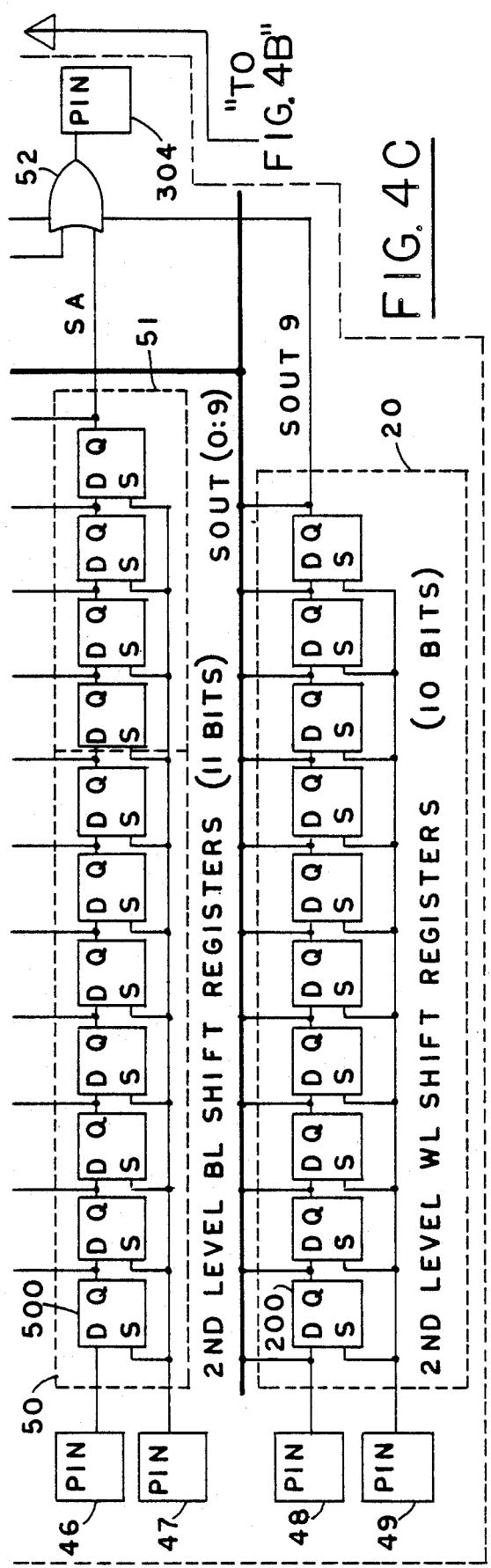

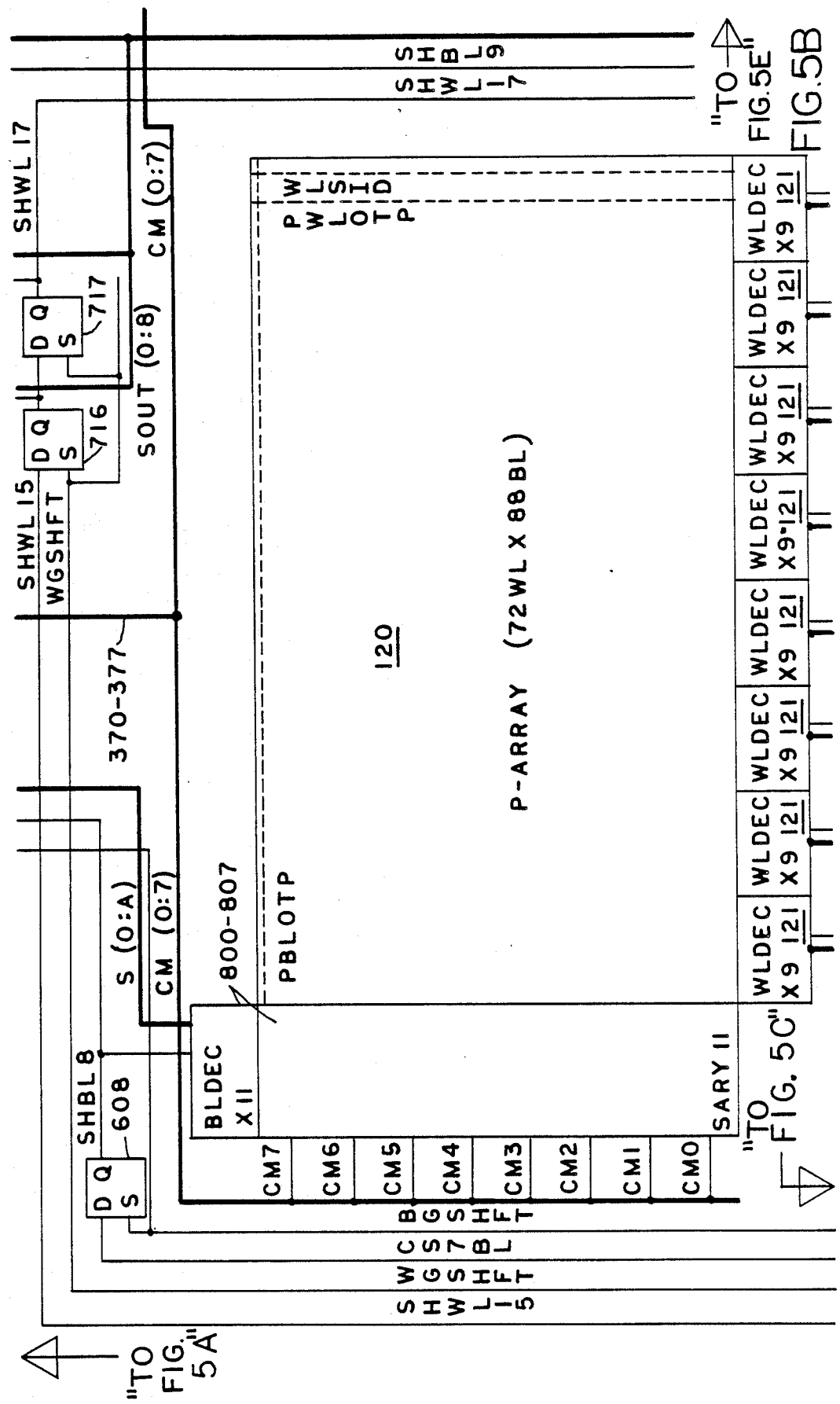

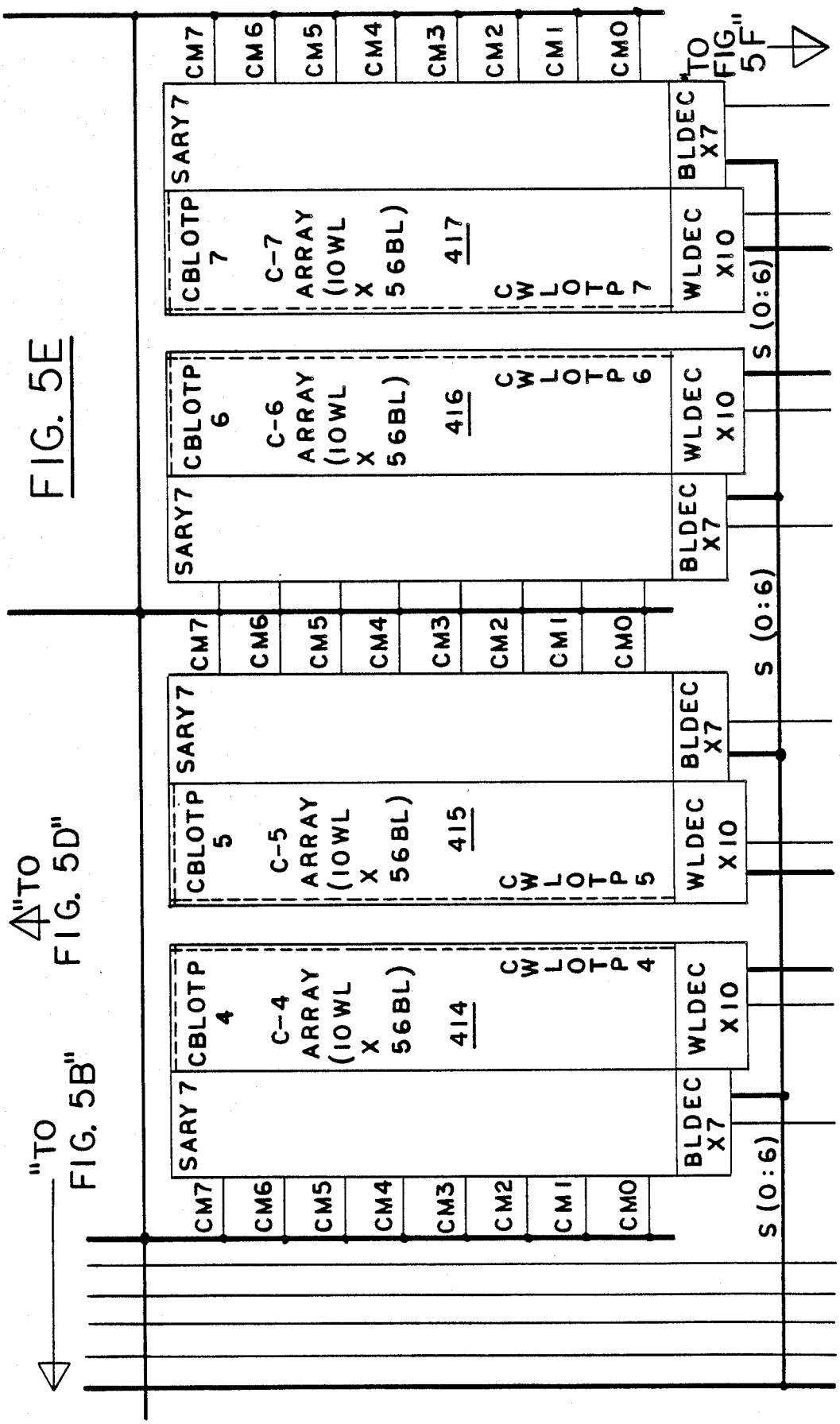

METHOD AND APPARATUS FOR PROGRAMMING AND VERIFYING PROGRAMMABLE ELEMENTS IN PROGRAMMABLE DEVICES

BACKGROUND OF THE INVENTION

Programmable logic devices of the types described generally in Spencer U.S. Pat. No. 3,566,153, Birkner et al. U.S. Pat. No. 4,124,899, Hartmann et al. U.S. Pat. No. 4,609,986, Hartmann et al. U.S. Pat. No. 4,617,479 and Hartmann et al. U.S. Pat. No. 4,713,792 can be implemented using fuses, anti-fuses, erasable programmable read-only memory (EPROM), electrically erasable programmable read-only memory (EEPROM) or flash EPROM as their programmable elements. Such devices are typically set up as basically orthogonal arrays of "bit lines" and "word lines" which can be programmably interconnected to achieve a desired logical result. It is known that the programmable interconnections in such devices can be programmed by addressing the appropriate bit lines and word lines, applying the desired programming data, and transferring that data to the interconnection by applying to the selected word lines and bit lines a predetermined programming voltage—e.g., a voltage significantly higher than that encountered in the normal logical operation of the device.

In a programmable device, a programmable array is generally organized as an array of $m \times n$ programmable elements. In general, to each of the m word lines are connected n EPROM gates, and to each of the n bit lines are connected m EPROM drains.

During programming, any bit at the intersection of a high voltage bit line and a high voltage word line will be programmed. In a conventional programming addressing scheme, in order to reduce the number of selection lines to be interfaced to the array for programming, the address information for the word lines and bit lines is binarily encoded. Thus for a $m \times n$ array, $\log_2 m$ address lines for the word lines and $\log_2 n$ address lines for the bit lines, each rounded up to the nearest whole number, are required. The total number of lines to address all interconnections uniquely is the sum of $\log_2 m$ rounded up to the nearest whole number and $\log_2 n$ rounded to the nearest whole number.

Providing the required number of address input lines presents little difficulty where the programmable logic device is on its own integrated circuit chip. However, for a chip containing several programmable logic devices as well as large numbers of other devices, it would be necessary in a conventional programming scheme to have at least as many programming address lines traced around the chip from programmable device to programmable device as are needed by that device needing the most programming lines. In fact, it might not be possible to use a set of address lines for more than one device, necessitating several times that number of lines. This could present some difficulty on an already densely packed chip. In addition, such chips would require a large number of addressing pins on the package, and additional silicon area to implement the decoders necessary to generate the programming lines going to the word lines and bit lines, in addition to the silicon area required to implement the required number of signal lines.

Also, for integrated circuit chips with multiple arrays of the same or different dimensions, it is necessary to customize the size of each decoder in terms of numbers of input lines and numbers of decoded output lines for each array block. Furthermore, it is generally prudent to physically place each decoder close to its associated array block to avoid to having to route the decoded lines across long distances across the chip. However, areas close to some of the arrays may be needed for other circuit functions during normal operation of the chip. These limitations may present difficulty for the integrated circuit designer in trading off the use of limited silicon area for signal lines and decoders for programming of the programmable elements on the one hand, and implementing other circuits necessary for the performance of intended logic functions during the normal operation of the chip on the other hand.

It would be desirable to be able to provide a way to program a programmable logic device on an integrated circuit chip which occupies a minimum of space on the chip.

SUMMARY OF THE INVENTION

It is an object of this invention to provide a way to program a programmable logic device on an integrated circuit chip which occupies a minimum of space on the chip.

In accordance with this invention, there is provided apparatus for programming a programmable logic array having at least m word lines, at least n bit lines, and at least $m \times n$ programmable interconnections. The apparatus includes means for applying programming data to the array and means for providing serial address information to the array for indicating for which of the programmable interconnections the programming data is intended.

A programming method is also provided.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIGS. 4A to 4C are a schematic representation of a programming circuit according to this invention for use with a programmable logic device; and FIGS. 5A to 5F are a schematic representation of a programming circuit according to this invention for use with more than one programmable logic device.

DETAILED DESCRIPTION OF THE INVENTION

Figure 1:
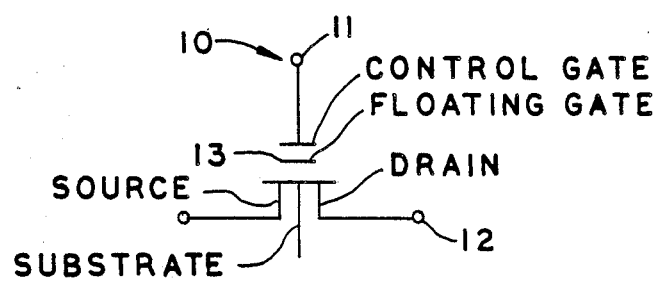
FIG. 1 is a schematic representation of an EPROM transistor used as a programmable interconnection element in programmable logic devices implemented with EPROM.
Figure 2:
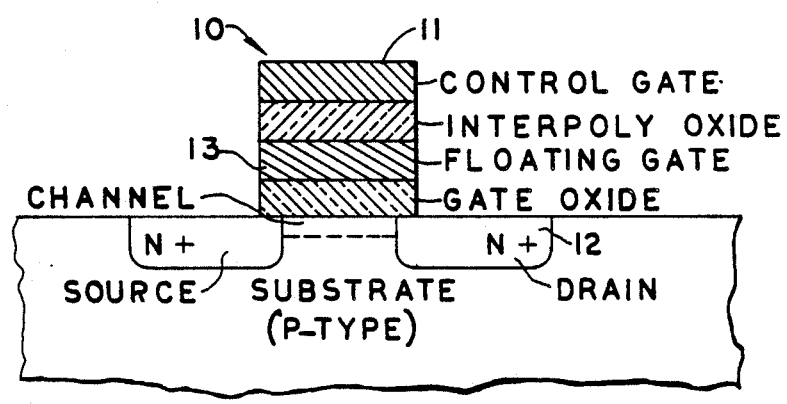
FIG. 2 is a cross-sectional view of the EPROM transistor of FIG. 1.

In the case of a programmable logic device using EPROM for its programmable elements, an EPROM element such as a floating gate field effect transistor 10, shown in FIGS. 1 and 2, commonly referred to as an EPROM transistor, is programmed when the voltage on its control gate 11 is at a voltage (e.g., 12 volts) that is significantly higher than the voltage during normal operation (typically 5 volts) and the voltage at the drain 12 of EPROM element 10 is at a voltage (e.g., 10–12 volts) higher than the voltage during normal operation (e.g., 5 volts).

The presence of high voltages at both gate 11 and drain 12 of EPROM transistor 10 causes electrons to be injected into the floating gate 13. Electrons on floating gate 13 remain trapped on floating gate 13 after high voltages are removed. The presence of electrons on floating gate 13 causes the threshold voltage as seen from control gate 11 to be substantially increased from its initial value (e.g., from an initial value of 1 to 2 volts to a new value above 5 volts) such that under normal gate voltages of +5 volts the transistor is not turned on. Thus an unprogrammed EPROM transistor will conduct with 5 volts on the gate and will not conduct with 0 volt on the gate, while a programmed EPROM transistor will not conduct in either state.

Figure 3A:
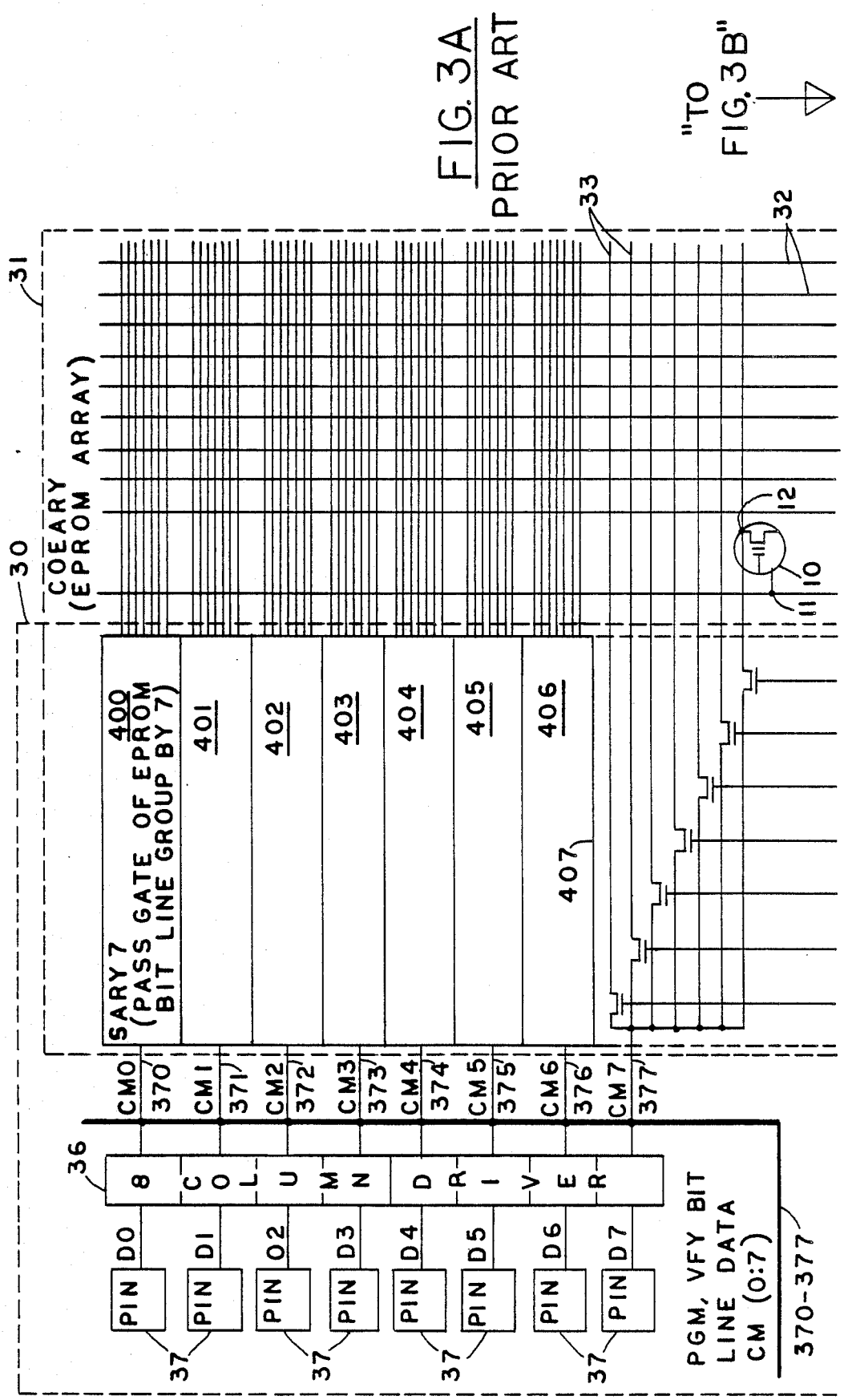
FIGS. 3A and 3B are a schematic representation of a known type of programming circuit for programmable logic devices.
Figure 3B:
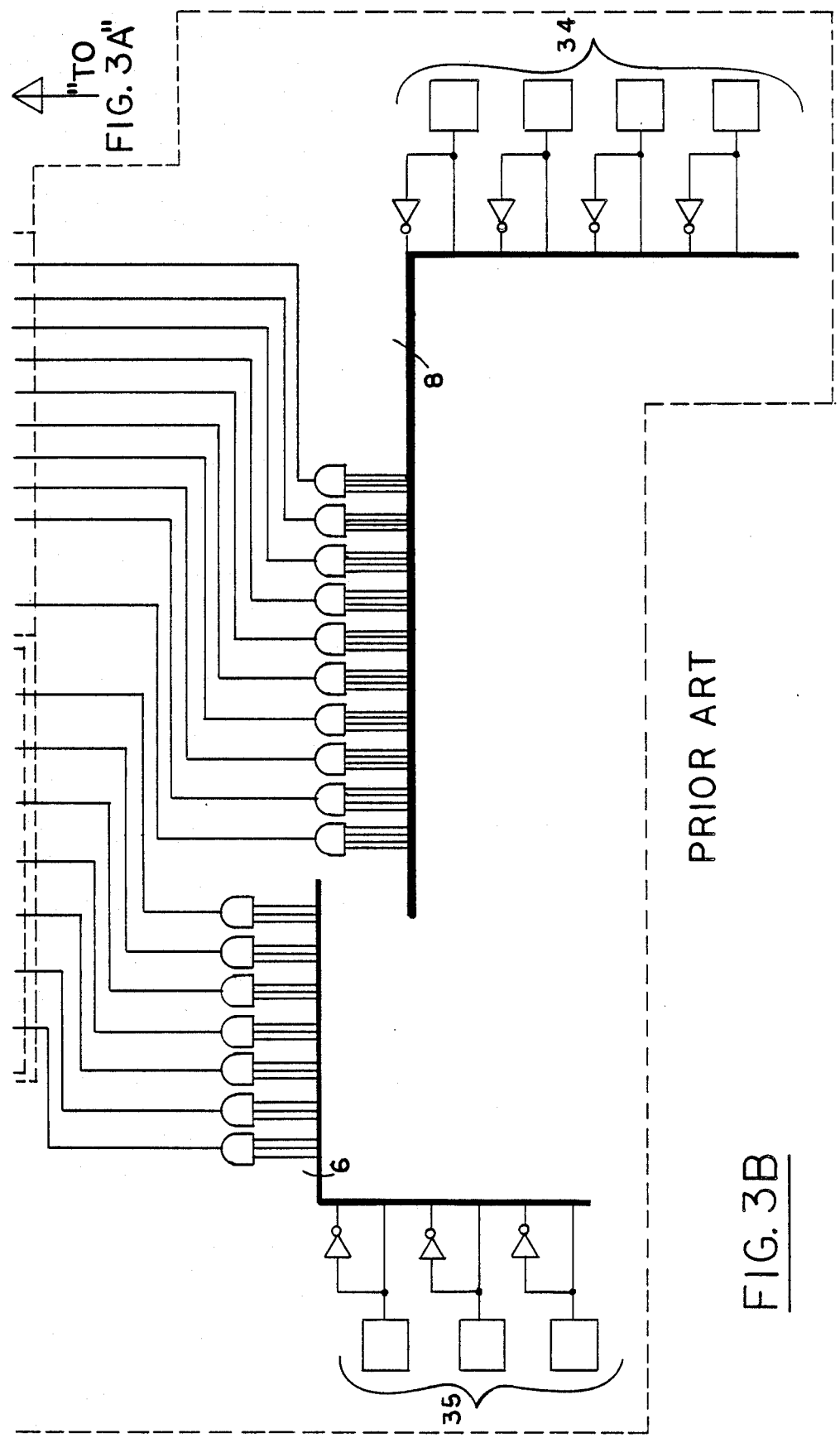

FIG. 3 shows a known programming circuit 30 for programming an array 31 of ten word lines 32 and fifty-six bit lines 33. It would take a total of 4+6=10 address input lines to uniquely address each of the EPROM cells. The number of address input lines to the bit lines can be reduced by programming the arrays one byte (eight bits) at a time in parallel, with the programming information coming into eight-bit column driver 36 via D0–D7 address pins 37. The number of bit lines to be decoded then reduces to 56/8=7, requiring three address lines. Thus in this particular example, seven input lines (four word line address inputs 34 and three bit line address inputs 35) have to be reserved or multiplexed to be used as address input lines.

Figure 4B:
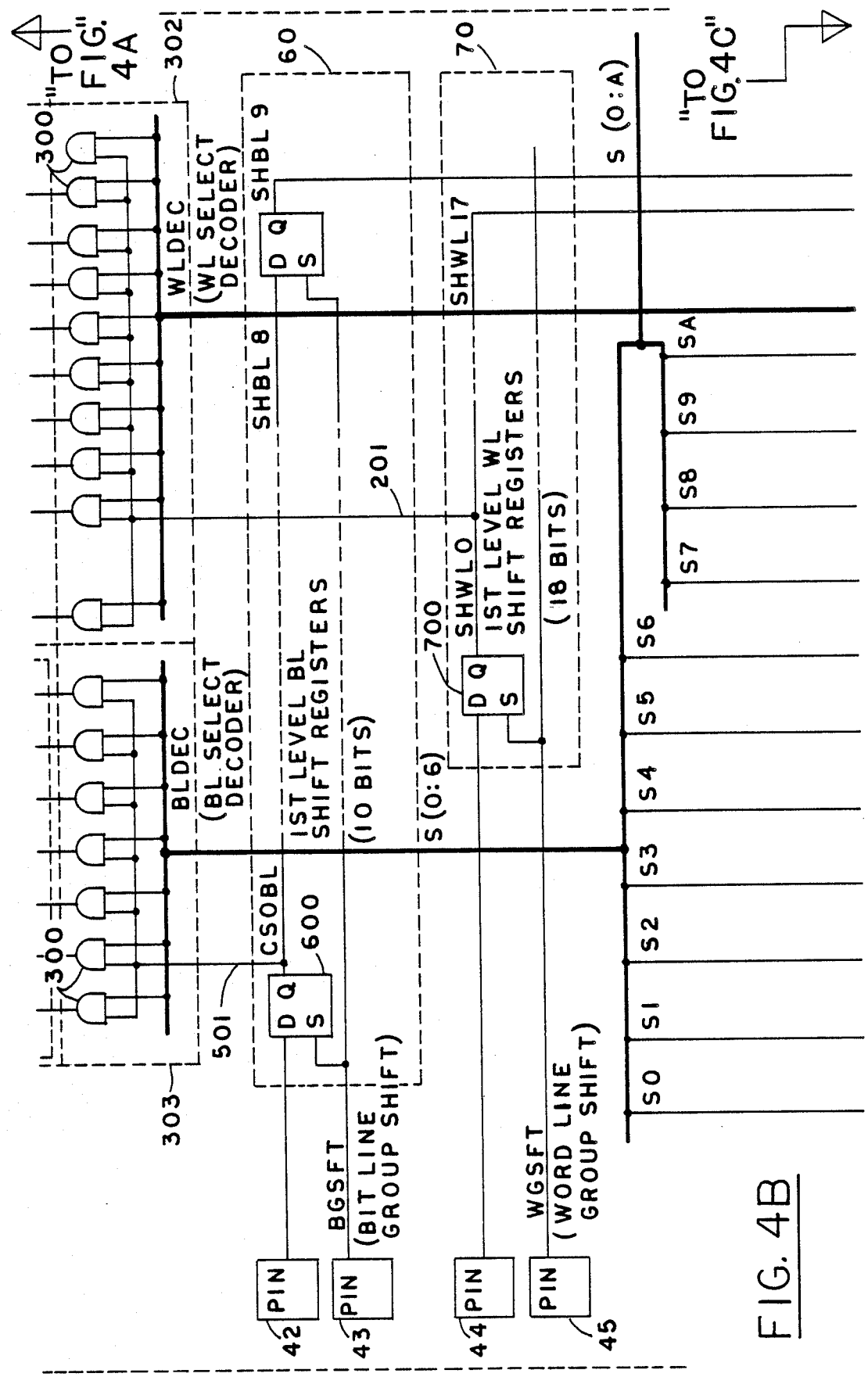
Figure 5A:
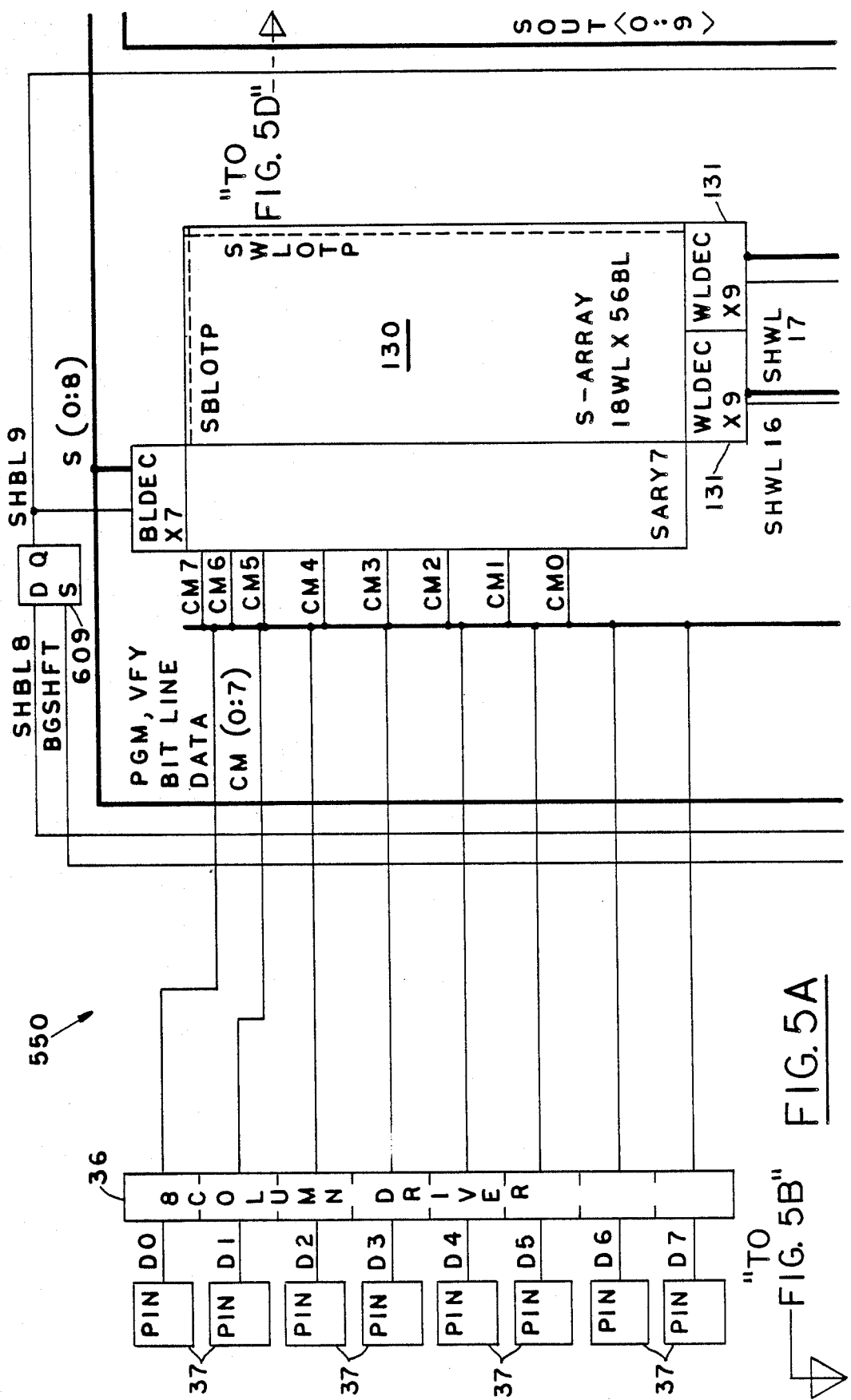
Figure 5D:
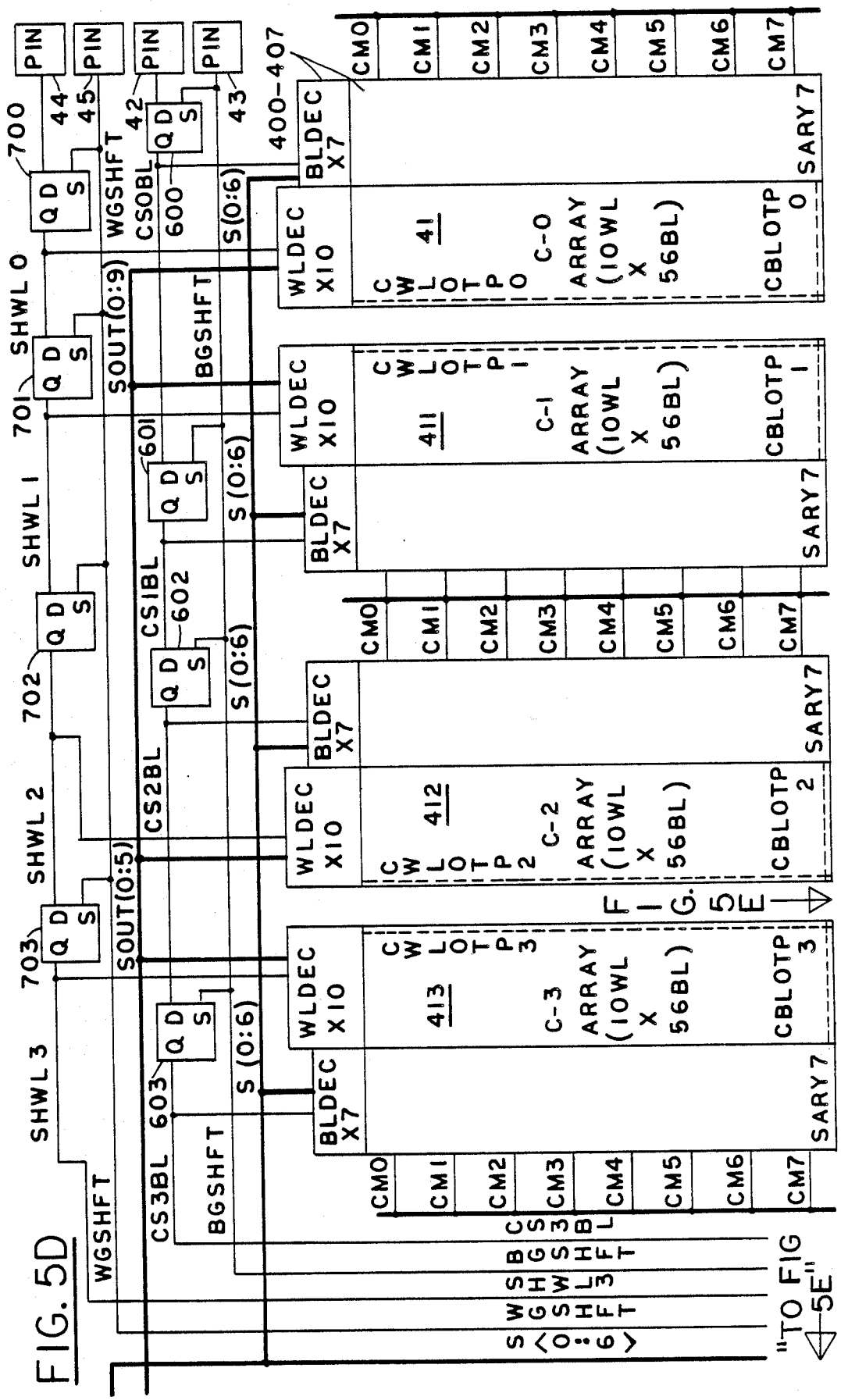
Figure 5C:
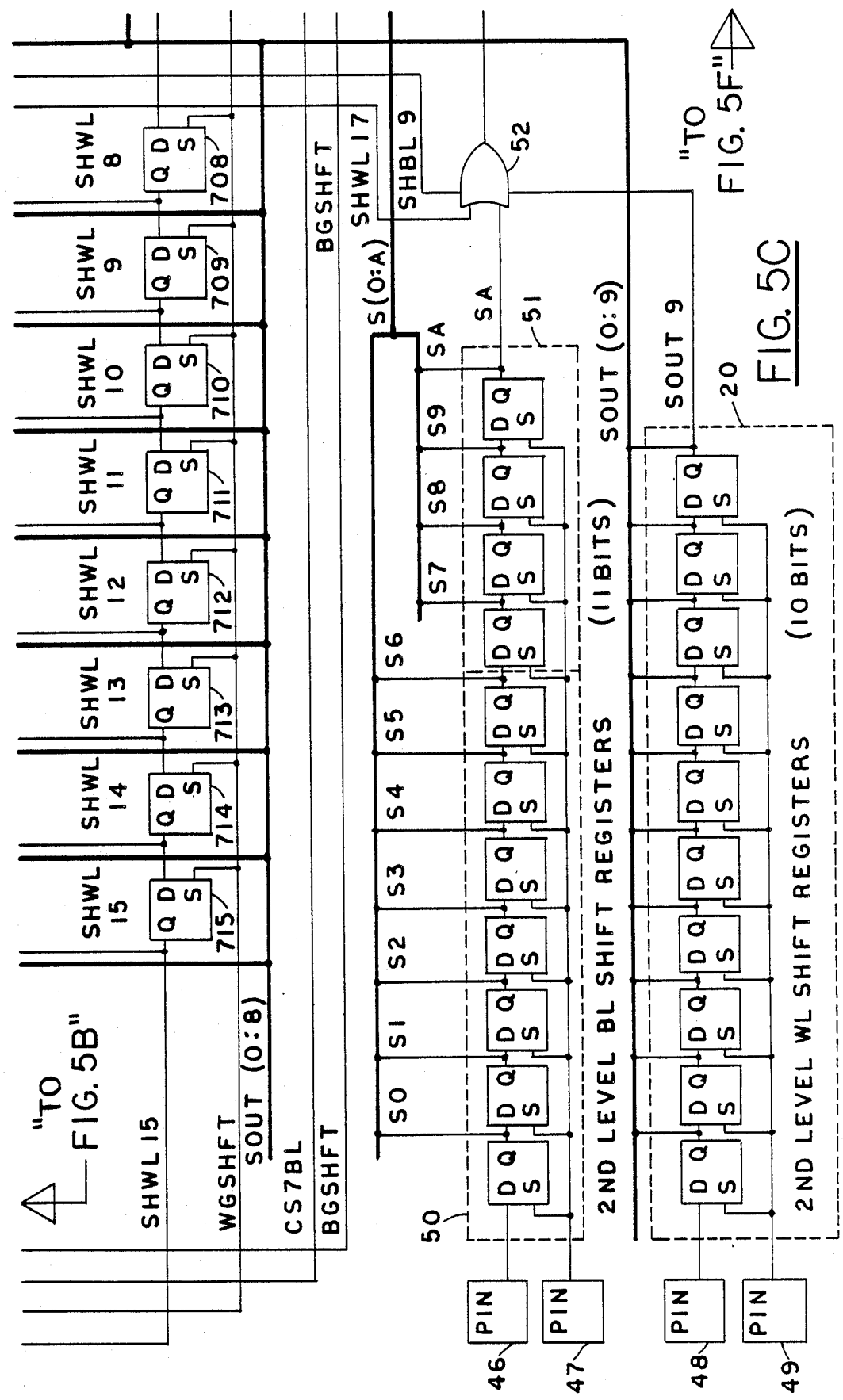
Figure 5F:
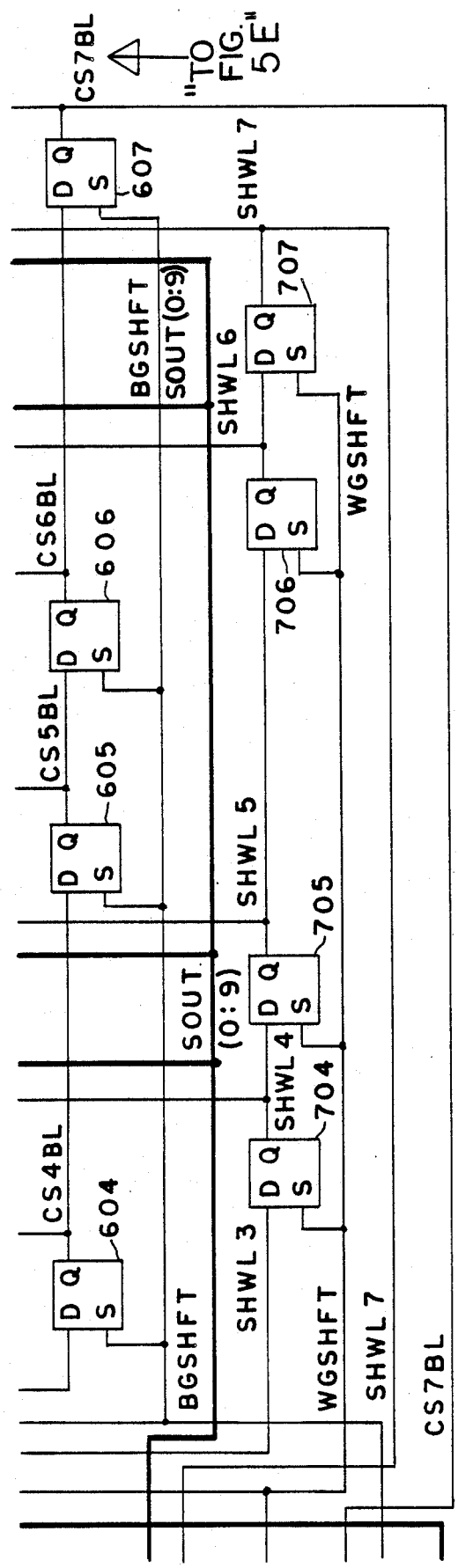

FIG. 4 shows a programming circuit according to the present invention as applied to a single EPROM array 41 consisting of ten word lines 32 and fifty-six bit lines 33. Each intersection of bit line and word line consists of an EPROM element 10 with its gate 11 connected to a word line 32 and its drain 12 connected to a bit line 33. Programming circuit 40 according to the invention is shown as being associated with array 41. No additional pins are added to the programmable integrated circuit device in order to accommodate programming circuit 40. Instead, pins which during normal operation of the chip perform functions related to data input/output, and input signal pins, will perform programming functions once the chip is placed in the programming mode.

The chip is placed in a programming mode by applying to a programming control pin (not shown) the extra-high voltage (typically 12 volts) referred to above. A second programming control pin (also not shown) is held in a logical low state (0 volt) during programming. Programming circuit 40 can also perform verification functions. To place the chip into a verification mode, the extra high voltage is applied to the second programming control pin as well. For both programming and verification operations, the manner in which EPROM cells 10 are addressed is the same, except that in programming mode, data to be programmed are inputted through the input path of data input/output lines of array 41 and translated to extra-high voltage levels on bit lines 33, and in verification mode, data from array 41 is read out through the output path of data input/output lines of array 41.

A plurality, y, of word line shift registers 200 of register block 20 (in FIG. 4, y=10) and a second plurality, z, of bit line shift registers 500 of register block 50 (in FIG. 4, z=7), are provided and are used to address word lines 32 and bit lines 33, respectively, for programming purposes. In order to reduce the number of bit line shift registers required, programming data is supplied to the array one byte (eight bits) at a time, from D0–D7 data input/output pins 37 through eight-bit column driver 36. In order to allow the output of the shift registers 200 and 500 to access the appropriate word lines and bit lines, first level bit line shift register block 60 selects the particular bit lines, and first level word line shift register block 70 selects the particular word lines, of array 41 that are activated. A logical "1" is shifted into shift register 600 from pin 42 by a clock input to pin 43 in register block 60, and a logical "1" is shifted into shift register 700 from pin 44 by a clock input to pin 45 in register block 70. The first level shift register blocks 60, 70 serve the purpose of selecting a particular array, or part thereof, for an integrated circuit with more than one programmable array, or a single large programmable array. The function of the first level shift registers will be clearer when considered in connection with programmable logic having a plurality of programmable arrays of possibly different dimensions, as discussed in more detail below in connection with FIG. 5.

In order to address an EPROM element 10 in a particular interconnection in array 41 in FIG. 4, the desired word line is addressed by clocking a logical "1" into shift registers 200 on line 48, controlled by a clock signal on line 49. This causes a logical "1" to be placed on the output of the shift register corresponding to the particular word line selected. To address the desired bit lines, a logical "1" is clocked into shift register 500 on line 46, controlled by a clock signal on line 47. After the correct number of clock pulses from lines 49 and 47, logical "1's" will have been placed on the output of shift registers 200 and 500 corresponding to selected word lines and bit lines. With outputs of first level registers 600, 700 of blocks 60, 70 each at a logical "1", the AND gates 300 for bit line drivers 303 and word line drivers 302 are enabled. The logical "1" outputs of AND gates 300 are at extra-high voltage (e.g., 12 volts) in the programming mode and at regular logical "1" voltage (e.g., 5 volts) in the verification mode.

Meanwhile, the programming data for the programmable interconnection being accessed will have been applied via D0–D7 data lines 37 to eight-bit column driver 36 connected to array 41 through lines 370–377. A logical "1" on shift register 500 turns on one of the N-channel MOS transistors 410 in each of blocks 400 through 407 allowing the extra-high voltage from eight-bit column driver 36 to be delivered selectively to particular bit lines of array 41. The programmed pattern on the array can be verified by entering the verification mode as described previously, in which case programmed bit pattern information may be read out on D0–D7 lines 37 in parallel format.

For a single array, it is not necessary to have first level shift register blocks 60, 70, nor pins 42–45. For the serial addressing scheme shown, the addressing of a single array of any dimensions requires only four input signal pins 46–49. Because clock pins 47 and 49 are two independent clocks, logical "1's" can be shifted into shift register blocks 50 and 20 at the same time. If one wishes to shift in a logical "1" into shift register block 50 before or after shifting a logical "1" into shift register block 20, then the data input pins 46, 48 can be common and combined into a single data input pin. Thus the addressing of a single array of any dimensions requires a minimum of only three input signal pins 47, 49 and 46 or 48, compared to the seven address input lines required even with the small array described in FIG. 3 using a conventional addressing scheme.

With the serial addressing circuit described, data shifted into the shift register blocks can be read out for verification of shift register operation. A pin 304, normally used for other signal output purposes, is used as shift register output monitor. Data from each block of shift registers can be clocked out on a per block basis, with clocks from other shift register blocks stopped so that three of the inputs to the OR gate 52 are at a logical "0". By counting the number of clock pulses before a logical "1" is detected on pin 304, the position and operation of the shift registers can be determined for the block being monitored.

FIG. 5 shows an embodiment of the serial addressing circuit of the invention in a programmable integrated circuit having ten programmable arrays. Eight arrays 41, 411–417 are of the same structure as in FIG. 4, each having ten word lines and fifty-six bit lines. Array 120 is a programmable array having seventy-two word lines and eighty-eight bit lines. Array 130 has eighteen word lines and fifty-six bit lines. Programming data for all of the arrays are supplied from D0–D7 lines 37 through high voltage eight-bit column driver 36 as described above for the case of a single array. The internal data lines 370–377 are common to all arrays.

The seventy-two word lines of array 120 are controlled by eight groups of word line drivers 121, each containing nine two-input AND gate word line drivers 300 as in block 302 of FIG. 4. The common inputs of each block of AND gates are controlled by shift registers 708–715 of block 70. Shift registers 708–715 of block 70 can select any one of eight word line driver blocks 121 by shifting a logical "1" to the appropriate shift register output by clocking pin 45. By shifting a logical "1" into the appropriate shift register 200 in block 20, one out of the nine word line drivers in each block 121 can be selected. As already shown in FIG. 4, shift register block 20 can also select the word lines of any of arrays 41, 411–417. Thus with the multi-level serial selection circuit of the invention, only eight additional shift registers 708–715, with one additional associated clock pin and one additional associated shift register block input pin, as compared to the number of registers and pins required in the minimum case, are needed to individually select seventy-two word lines of array 120.

Programming data for the eighty-eight bit lines of array 120 are applied through D0–D7 lines 37, and eight-bit column driver 36, eight bits at a time in parallel. Thus it takes eleven shift register bits to select one of the eleven bit lines in each one of blocks 800–807 by selecting one out of eleven N-channel MOS transistors 410, in the same manner as described in connection with FIG. 4 for selecting the appropriate transistors in blocks 400–407. Since a logical "1" clocked into first level shift register 608 of block 60 by clocking pin 43 selects array 120, the seven bits of shift register block 50 can be concatenated with four extra bits of block 51 to form an eleven-bit shift register chain to select one out of eleven bit lines. Thus, the number of shift registers does not grow directy as the number lines on the integrated circuit chip 550 to be selected. Rather, the number of shift registers at most equals the number of lines to be selected in the largest one of the several programmable arrays on the integrated circuit chip.

Similarly in array 130, nine of the ten-bit shift registers 20 are used to select one out of nine word line drivers in blocks 131 and first level shift register bits 716, 717 select one of the two blocks 131 of word line drivers. Thus in the same manner described above one out of the eighteen word lines in array 130 can be individually addressed. Seven of the eleven shift registers in blocks 50, 51 are used to select the fifty-six bit lines in eight data groups.

Since clock pins 43, 45, 47, 49 are all independently controlled, pins 42, 44, 46 and 48 can be combined into one data input pin if one is willing to shift the logical "1"s into shift register blocks 600–609, 700–717, 50–51, 20 one block after another in the same manner as described for the single array of FIG. 4. The total number of input pins then required will be reduced from eight to only five (43, 45, 47, 49 and 42 or 44 or 46 or 48) by combining pins 42, 44, 46 and 48 into one pin. Alternatively, data pins 42, 44, 46, 48 can remain independent and clock pins 43, 45, 47, 49 can be combined.

As shown, the programming circuit of chip 550 in FIG. 5 serially addresses the programmable interconnections to be programmed in each of arrays 120, 130, 41, 411–417. By using serial addressing, only five (for a 2-level shift register scheme), and as few as three (for a single level shift register scheme), programming address lines need to be brought from input pins of chip 550 to the arrays to be programmed, reducing the number of input pins required on the chip for programming and verification. Furthermore, by using two levels (or even multiple levels) of shift registers to select among multiple arrays or among parts of large arrays, the number of shift registers can be further reduced as compared to direct addressing, because on a chip with multiple programmable arrays or large arrays, the same shift registers can be used for all arrays, even those of different sizes, and for the different parts of the large arrays if they are programmed in parts.

An additional advantage of serial addressing is that by shifting more than one logical "1" into the shift register chain, any chosen number of lines can be selected simultaneously. Applications of multiple selections include programming of the array more than a byte at a time to save programming time. During reliability testing of the programmable arrays, it may be desirable to stress the programmable elements in such a way that all word lines are at logical "1"s and all bit lines are at logic "0". Serial addressing as described allows such addressing without any additional circuits.

Thus it is seen that a programming circuit and method for programming a programmable logic device on an integrated circuit chip is provided, the circuit occupying a minimum of space on the chip. One skilled in the art will appreciate that the present invention can be practiced by other than the described embodiments, which are presented for purposes of illustration and not of limitation, and the present invention is limited only by the claims which follow.

What is claimed is:

1. Apparatus for programming a programmable integrated circuit having at least one programmable logic array, said at least one programmable logic array having at least m word lines, at least n bit lines, and at least m×n programmable interconnections, said apparatus comprising:

means for applying programming data to said array; and means for providing serial address information to said array for indicating, at random, for which of said programmable interconnections said programming data is intended.

2. Apparatus for programming a programmable integrated circuit having at least one programmable logic array, said at least one programmable logic array having at least m word lines, at least n bit lines, and at least m×n programmable interconnections, said apparatus comprising:
    means for applying programmable data to said array; and
    means for providing serial address information to said array for indicating for which of said programmable interconnections said programming data is intended, said serial address information providing means comprising:
    m shift registers associated with said word lines,
    n shift registers associated with said bit lines,
    first address information applying means for applying address information to said m shift registers,
    second address information applying means for applying address information to said n shift registers,
    first address information clocking means for applying a clock signal to said m shift registers for shifting said address information applied thereto,
    second address information clocking means for applying a clock signal to said n shift registers for shifting said address information applied thereto, and
    means for causing transfer of said programming data to that one of said programmable interconnections indicated by said address information in said m shift registers and said n shift registers.

3. The programming apparatus of claim 2 wherein said programming data transfer causing means comprises means for applying a programming signal to said array after a complete address has been clocked into said shift registers for transferring said programming data to said programmable interconnection.

4. The programming apparatus of claim 2 further comprising means for verifying said transferred programming data.

5. The programming apparatus of claim 4 wherein said verifying means comprises means for applying a verification signal for reading back said transferred programming data from said programmable interconnection.

6. The programming apparatus of claim 2 wherein said programmable logic array is an erasable programmable read-only memory array.

7. The programming apparatus of claim 6 wherein said erasable programmable read-only memory array is a CMOS erasable programmable read-only memory array.

8. The programming apparatus of claim 6 wherein said programmable logic array is an electrically erasable programmable read-only memory array.

9. The programming apparatus of claim 2 wherein said programmable logic array is a fusible link array.

10. The programming apparatus of claim 2 wherein said programmable logic array is an anti-fuse array.

11. The programming apparatus of claim 2 wherein said programmable integrated circuit has more than one programmable logic array of possibly varying sizes, one of said programmable logic arrays having at least m word lines and at least n bit lines, said programming apparatus further comprising:
    a first group select shift register associated with said word lines;
    means for applying data and clock signals to said first group select shift register for indicating that one of said programmable logic arrays to the word lines of which said address information in said m word line shift registers applies;
    a second group select shift register associated with said bit lines; and
    means for applying data and clock signals to said second group select shift register for indicating that one of said programmable logic arrays to the bit lines of which said address information in said n bit line shift registers applies.

12. The programming apparatus of claim 11 wherein said one of said programmable logic arrays has fewer than m word lines; and
    an appropriate subset of said m word line shift registers is used for programming said one of said programmable logic arrays.

13. The programming apparatus of claim 11 wherein:
    said one of said programmable logic arrays has fewer than n bit lines; and
    an appropriate subset of said n bit line shift registers is used for programming said one of said programmable logic arrays.

14. The programming apparatus of claim 11 wherein:
    said one of said programmable logic arrays has more than m word lines; and
    said word line group select shift registers indicate for which of said more than m word lines said address information in said m word line shift registers is intended.

15. The programming apparatus of claim 11 wherein:
    said one of said programmable logic arrays has more than n bit lines; and
    said bit line group select shift registers indicate for which of said more than n bit lines said address information in said n bit line shift registers is intended.

16. The programming apparatus of claim 14 wherein said word line group select shift registers can indicate that said address information in said m word line shift registers is intended for more than m word lines.

17. The programming apparatus of claim 15 wherein said bit line group select shift registers can indicate that said address information in said n bit line shift registers is intended for more than n word lines.

18. The programming apparatus of claim 2 wherein said address information in said m shift registers selects one of said word lines for application of programming data on said bit lines.

19. The programming apparatus of claim 2 wherein said address information in said m shift registers selects more than one of said word lines for application of programming data on said bit lines.

20. The programming apparatus of claim 2 wherein said address information in said n shift registers selects one of said bit lines for application of programming data on said word lines.

21. The programming apparatus of claim 2 wherein said address information in said n shift registers selects more than one of said bit lines for application of programming data on said word lines.

22. The programming apparatus of claim 2 wherein said first and second address information applying means are combined, said first and second address information clocking means controlling application of address information to said m shift registers and said n shift registers.

23. The programming apparatus of claim 2 wherein said first and second address information clocking means are combined, said first and second address information applying means controlling application of address information to said m shift registers and said n shift registers.

24. A method for programming a programmable integrated circuit having at least one programmable logic array, said at least one programmable logic array having at least m word lines, at least n bit lines, and at least m×n programmable interconnections, said method comprising the steps of:
  applying programming data to said array; and
  providing serial address information to said array for indicating, at random, for which of said programmable interconnections said programming data is intended.

* * * * *